United States Patent

Adler et al.

[15] 3,701,041

[45] Oct. 24, 1972

[54] AMPLITUDE STABILIZED COMPLEMENTARY TRANSISTOR OSCILLATOR

[72] Inventors: Karl-Heinz Adler; Helmut Domann Leonberg; Johannes Locher, all of Stuttgart, Germany

[73] Assignee: Robert Bosch GmbH, Stuttgart, Germany

[22] Filed: Feb. 5, 1971

[21] Appl. No.: 112,963

[30] Foreign Application Priority Data

Feb. 26, 1970 Germany..........P 20 08 902.5

[52] U.S. Cl..................331/65, 331/108 A, 331/109, 331/117 R, 331/183

[51] Int. Cl.............................H03b 3/02, H03b 5/12

[58] Field of Search....331/65, 109, 117 R, 168, 183, 331/108 A, 116 R

[56] References Cited

UNITED STATES PATENTS

| | | | |
|---|---|---|---|
| 2,760,070 | 8/1956 | Keonjian | 331/117 X |
| 3,213,390 | 10/1965 | Faith et al | 331/109 |

*Primary Examiner*—Roy Lake
*Assistant Examiner*—Siegfried H. Grimm
*Attorney*—Michael S. Striker

[57] ABSTRACT

Part of the output of a push pull Clapp oscillator is rectified and smoothed to provide a voltage for stabilizing the oscillation amplitude, the control voltage being fed to the base of a transistor that acts as a variable resistance in a voltage divider connected to the bases of the push pull oscillator transistors, the controlled conduction of the voltage divider transistor acting to control the working points of the oscillator transistors so as to maintain a substantially constant oscillation amplitude.

10 Claims, 1 Drawing Figure

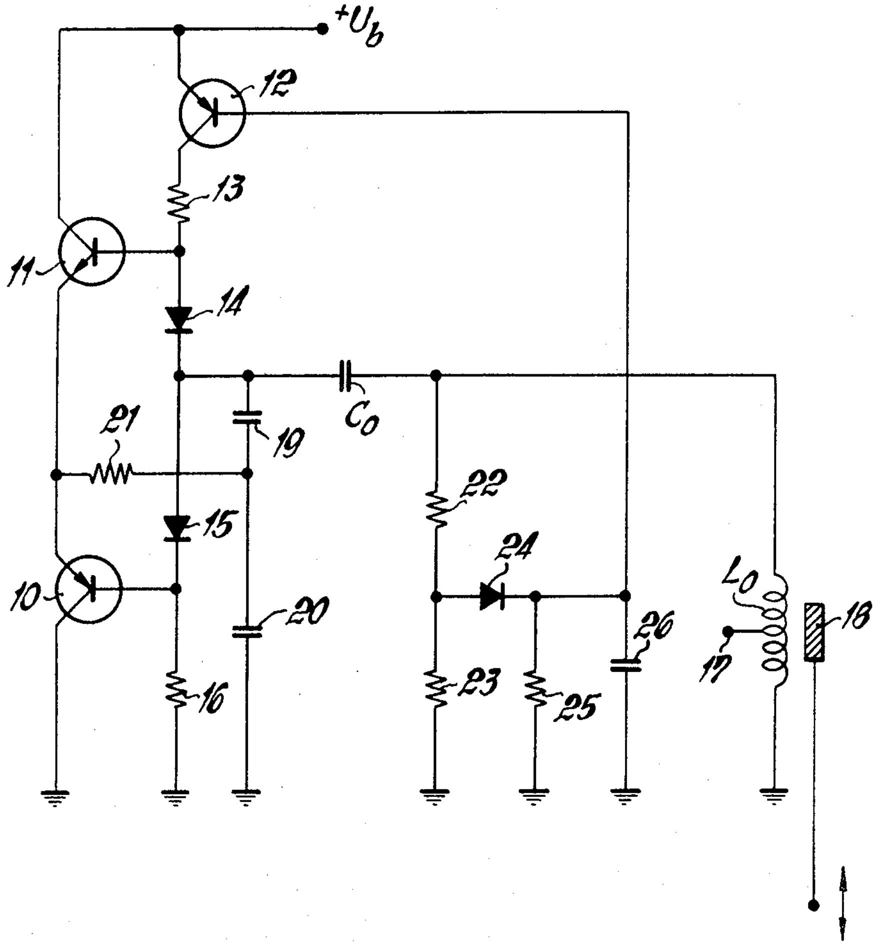
INVENTORS
Karl-Heinz ADLER
Helmut DOMANN
Johannes LOCHER
BY
their ATTORNEY

AMPLITUDE STABILIZED COMPLEMENTARY TRANSISTOR OSCILLATOR

BACKGROUND OF THE INVENTION

The invention relates to an amplitude stabilized oscillator having a series resonant circuit and an amplifier for providing energy to the resonant circuit.

In known oscillators, a change in the Q of the resonant circuit usually causes a change in the oscillation amplitude. Amplitude changes can also be caused by outside disturbances or by parasitic capacitances that change in value. Particularly where the oscillator is used to feed an inductive motion, or displacement, pickup, small changes in Q, as a consequence of the inductive pickup changing the values of the resonant circuit, cannot be avoided.

SUMMARY OF THE INVENTION

An object of the invention is to provide an oscillator that is particularly suited to inductive motion, or displacement, pickups, the oscillation amplitude being unaffected by the aforesaid factors.

Another object of the invention is an oscillator of the previous object that is so stably constructed that is can be built into a motor vehicle. Since the motion pickup is used to provide a signal dependent on a movement, the measuring accuracy essentially hinges on the properties of the oscillator.

Briefly, the invention consists of a series resonant circuit, first and second complementary amplifying transistors, the emitters of the first and second transistors being connected together to form a series connection between the emitter-collector paths of the first and second transistors, the series resonant circuit being connected to the junction between the emitters to permit energy to be furnished to the resonant circuit, and circuit means connected to the series resonant circuit for obtaining a control voltage proportional to the amplitude of the oscillation and for applying the control voltage to the first and second transistors to shift the working points thereof so as to maintain the oscillation amplitude substantially constant.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

The FIGURE of the drawing shows one circuit embodiment of the oscillator of the invention.

DESCRIPTION OF THE PREFERRED EMBODIMENT

With reference to the Figure, the Clapp oscillator comprises the complementary oscillator transistors 10 and 11. The collector of the npn transistor 11 is connected to the source of operating voltage $+U_b$; the emitter is connected to the emitter of the pnp transistor 10, the collector of which latter is connected to ground. The voltage divider connected to the bases of the oscillator transistors is composed of the series connection of a control transistor 12, a resistor 13, at least two diodes 14 and 15 connected between the bases, and of a resistor 16. The emitter of the control transistor is connected to the voltage source $+U_b$, and the free terminal of the resistor 16 is connected to ground. The base of transistor 11 is connected to the anode of the diode 14, the cathode of which is connected to the anode of the diode 15, the cathode of which is connected to the base of the oscillator transistor 10. Connected between the diodes 14 and 15 is the series resonant circuit consisting of the capacitor $C_o$ and of the inductor $L_o$. The inductor $L_o$ is constructed as a differential reactor having a center tap 17 and a movable core 18, the movement of which changes the ratio of the inductive reactance between the two halves of the reactor. In the present exemplary embodiment of the invention, the inductor $L_o$ is a motion, or displacement, pickup for sensing movement. Also connected between the diodes 14 and 15 are two series connected capacitors 19 and 20, which compose a capacitive voltage divider. The tap of this capacitive voltage divider —the junction between the two capacitors— is connected by a resistor 21 to the junction between the emitters of the oscillator transistors 10 and 11. A further voltage divider, consisting of the resistors 22 and 23, is connected between ground and the junction between the resonant circuit capacitor $C_o$ and inductor $L_o$. The anode of a diode 24 is connected to the junction between the resistors 22 and 23. A resistor 25 and a capacitor 26 are connected in parallel between ground and the cathode of this diode. The voltage on the un-grounded plate of the capacitor 26 is the control voltage for the control transistor 12, this voltage being connected directly to the base of the transistor. The control transistor 12 acts as a resistance that varies in dependence on the value of the voltage fed to the base of transistor 12.

The circuit just described operates in the following manner. The oscillator is composed of the oscillator transistors 10 and 11, the capacitors 19 and 20, and of the resonant circuit capacitor $C_o$ and inductor $L_o$. The oscillator transistors are controlled by the voltage across the capacitor 19, this voltage being developed by the oscillating current flowing in the series connected resonant circuit and is, depending upon its polarity, being conducted by the diodes 14 and 15 to the bases of the respective transistors 10 and 11 so that in one polarity current flows from the source of voltage $+U_b$ through the diode 14, the capacitor 19, the resistor 21, and the emitter-collector path of the transistor 10, while in the other polarity current flows in the emitter-collector of the transistor 11, the resistor 21, the capacitor 19 and the diode 15 to ground. The voltage divider, composed of the resistors 22 and 23, conducts a part of the oscillator voltage to the diode 24, which rectifies the voltage, the RC network, composed of the resistor 25 and capacitor 26, smoothing the rectified output of the diode 24. The ratio between the resistors 22 and 23 determine the amplitude of the oscillation. The rectified and smoothed voltage at the capacitor 26 provides a control voltage that is positive with respect to ground. This control voltage, fed to the base of the control transistor 12, causing a reduction of the idling current of the push pull connected oscillator transistors 10 and 12 when the oscillation amplitude increases, acts to shift the working points of these two transistors so as to reduce the amplitude of oscillation. The capacitor 20 is charged and discharged by the emitter currents, to restore energy to the resonant circuit, the emitter currents reversing every half cycle through the small negative feedback resistor 21, the latter improving the wave form of the output of the oscillator.

In accordance with the invention, the oscillator can also be used for purposes other than feeding an inductive motion, or displacement, pickup.

A particularly important advantage of the embodiment illustrated and described is that the inductive motion pickup is also the resonant circuit inductor.

A further significant advantage of the oscillator of the invention arises from the use of two complementary oscillator transistors instead of a single oscillator transistor. In a Clapp circuit having only a single transistor, the resonant circuit capacitor discharges through a shunt resistor, which is also the emitter resistor of the transistor. When the capacitor charges, the charging current divides, that part passing through the resistor being lost to the resonant circuit. The oscillator of the invention, having two series connected complementary transistors, does not have this drawback, since the oscillator transistor shunted across the capacitor is not conductive while the latter is charging. For this reason, the current drawn by the circuit with two oscillator transistors is appreciably less, so that the pulse-like consumption of current from the current source likewise has less effect on other electrical apparatus connected to the same current source; and measures undertaken to reduce this effect are simpler and less expensive.

An important advantage of the Clapp oscillator as compared to other oscillators is that the amplitude of the oscillation is not limited by the operating voltage. If a Clapp oscillator supplies energy to an inductive motion pickup, the large voltage across the pickup ensures a greater measuring accuracy than with the use of oscillators, the voltage output of which is determined by the operating voltage.

It will be understood that each of the elements described above, or two or more together, may also find a useful application in other types of circuits differing from the types described above.

While the invention has been illustrated and described as embodied in an amplitude stabilized sine wave oscillator, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

We claim:

1. An amplitude stabilized oscillator comprising, in combination, a source of D.C. voltage; reference means defining a circuit reference point, one pole of said source being connected to said reference means; complementary first and second transistors having interconnected emitters, the collectors of said first and second transistors being respectively connected to the other pole of said source and to said reference means; a resonant circuit having at least two energy storing elements connected to each other to form a tap point, one of which elements connects said interconnected emitters and each of the bases of said transistors and the other of which elements is connected between the bases of said transistors and said reference means; and circuit means connected to said resonant circuit for obtaining a control voltage proportional to the amplitude of the oscillations and for applying said control voltage to said transistors to shift the working points thereof so as to maintain the oscillation amplitude substantially constant.

2. A combination as defined in claim 1, wherein said resonant circuit has a third energy storing element connected between said interconnected emitters and said reference means.

3. A combination as defined in claim 2, wherein said one and third energy storing elements are capacitors, and said other energy storing element is an inductor.

4. An oscillator as defined in claim 3, wherein the inductor of said resonant circuit is a motion pickup inductor.

5. A combination as defined in claim 3, wherein the oscillator is a Clapp oscillator and, wherein said resonant circuit further comprises a fourth energy storing element which is a capacitor connected in series with said inductor, whereby the combination of said one and third energy storing elements are arranged parallel to the combination of said other and fourth energy storing elements.

6. A combination as defined in claim 5, further comprising first and second diodes connected in series between the two bases and arranged to conduct current in the same direction as the collector-emitter paths of said transistors, said resonant circuit tap point being connected to the connection point between said diodes; a resistor connected between said interconnected emitters and a point joining said one and third energy storing elements.

7. A combination as defined in claim 6, further comprising a voltage divider comprising a first resistor connected between the base of said first transistor and said one pole, and second resistor connected between the base of said second transistor and said reference means.

8. A combination as defined in claim 7, wherein said voltage divider includes a third transistor having its emitter-collector path connected in series with said first and second resistors, the base of said third transistor being arranged to have applied thereto said control voltage so as to vary the conductivity of said third transistor in dependence on the value of said control voltage to thereby change the operating points of said first and second transistors.

9. A combination as defined in claim 8, wherein said voltage divider is connected between said reference means and said source of voltage.

10. An oscillator as defined in claim 8, wherein said circuit means includes rectifying means connected to said resonant circuit to rectify a portion of the output thereof, and voltage smoothing means connected to said rectifying means for smoothing the output thereof, the output of said voltage smoothing means being connected to the base of said third transistor.

* * * * *